United States Patent [19]

Matsuzaki

[11] Patent Number: 5,450,362

[45] Date of Patent: Sep. 12, 1995

[54] SEMICONDUCTOR INTEGRATED CIRCUIT DEVICE

[75] Inventor: Yasuro Matsuzaki, Kawasaki, Japan

[73] Assignee: Fujitsu Limited, Kawasaki, Japan

[21] Appl. No.: 226,849

[22] Filed: Apr. 13, 1994

[30] Foreign Application Priority Data

Sep. 6, 1993 [JP] Japan .................. 5-220369

[51] Int. Cl.$^6$ .................. G11C 7/00; G01R 31/28
[52] U.S. Cl. .................. 365/201; 305/189.09; 305/189.11; 305/149; 395/183.18
[58] Field of Search .............. 365/201, 189.09, 189.11, 365/149; 371/10.1, 21.1, 22.5

[56] References Cited

U.S. PATENT DOCUMENTS

| | | | |
|---|---|---|---|
| 5,177,745 | 1/1993 | Rozman | 371/21.1 |
| 5,276,647 | 1/1994 | Matsui et al. | 365/201 |
| 5,289,475 | 2/1994 | Slemmer | 371/21.1 |
| 5,317,532 | 5/1994 | Ochii | 365/149 |

Primary Examiner—David C. Nelms
Assistant Examiner—Huan Hoang
Attorney, Agent, or Firm—Staas & Halsey

[57] ABSTRACT

A semiconductor integrated circuit device having internal circuits, and a test mode selecting circuit. The selecting circuit includes a first load device, a transistor having a first terminal receiving a signal via the first load device, a control terminal receiving a first voltage and a second terminal, and a second load device provided between the second terminal of the transistor and a reference voltage node. A test mode selecting signal is output via the second terminal of the transistor when a second voltage higher than the voltage of the signal applied to the first load device in a normal operation mode is applied thereto. The test mode selecting signal is applied to predetermined internal circuits among said internal circuits, so that the predetermined internal circuits are switched to states of a test mode from the normal operation mode.

12 Claims, 8 Drawing Sheets

SEMICONDUCTOR INTEGRATED CIRCUIT DEVICE

BACKGROUND OF THE INVENTION

1. Field of the Invention

The present invention generally relates to semiconductor integrated circuit devices and, more particularly, to a semiconductor integrated circuit device equipped with a test mode selecting circuit that detects a test mode voltage applied to a predetermined external-connection terminal and which test mode voltage is higher than a normal voltage applied thereto in a normal operation mode and sets internal circuits to a test mode.

2. Description of the Prior Art

An SRAM (Static Random Access Memory) device is known having a built-in test mode selecting circuit as described above. A conventional built-in test mode selecting circuit includes a plurality of MOS transistors. The operation of the test mode selecting circuit greatly depends on the characteristics of the MOS transistors, more particularly, the threshold voltages thereof. If there is a difference in the threshold voltages between SRAM devices, the respective test mode selecting circuits will operate in different manners. If the threshold voltages of the MOS transistors deviate from the designed threshold voltages, the selecting circuit formed by these MOS transistors will malfunction. A test mode voltage, higher than a normal voltage, applied to a predetermined terminal will fail to cause the test mode selecting circuit to set the internal circuits to the test mode.

SUMMARY OF THE INVENTION

It is a general object of the present invention to provide a semiconductor integrated circuit device having a test mode selecting circuit in which the above disadvantage is eliminated.

A more specific object of the present invention is to provide a semiconductor integrated circuit device having a test mode selecting circuit capable of stably performing the mode switching operation even if there are differences among the characteristics of transistors forming the selecting circuit.

The above objects of the present invention are achieved by a semiconductor integrated circuit device comprising internal circuits and a test mode selecting circuit, the test mode selecting circuit comprising a first load device, a transistor having a first terminal receiving a signal via the first load device, a second terminal, a control terminal receiving a first voltage and a second load device provided between the second terminal of the transistor and a reference voltage node, a test mode selecting signal being output via the second terminal of the transistor when a second voltage higher than the voltage of the signal applied to the first load device in a normal operation mode is applied thereto, the test mode selecting signal being applied to predetermined internal circuits among the internal circuits, so that the predetermined internal circuits are switched to states of a test mode from the normal operation mode.

The above objects of the present invention are also achieved by a semiconductor memory device comprising a memory cell array having memory cells connected to word lines and bit lines, driving circuits for driving the word lines and bit lines, address circuits for sending the driving circuits signals necessary for driving the word lines and bit lines, a test mode selecting circuit comprising a first load device, a transistor having a first terminal receiving a signal via the first load device, a second terminal, a control terminal receiving a first voltage, and a second load device provided between the second terminal of the transistor and a reference voltage node, a test mode selecting signal being output via the second terminal of the transistor when a second voltage higher than the voltage of the signal applied to the first load device in a normal operation mode is applied thereto, so that the driving circuits are switched to states of a test mode from the normal operation mode.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
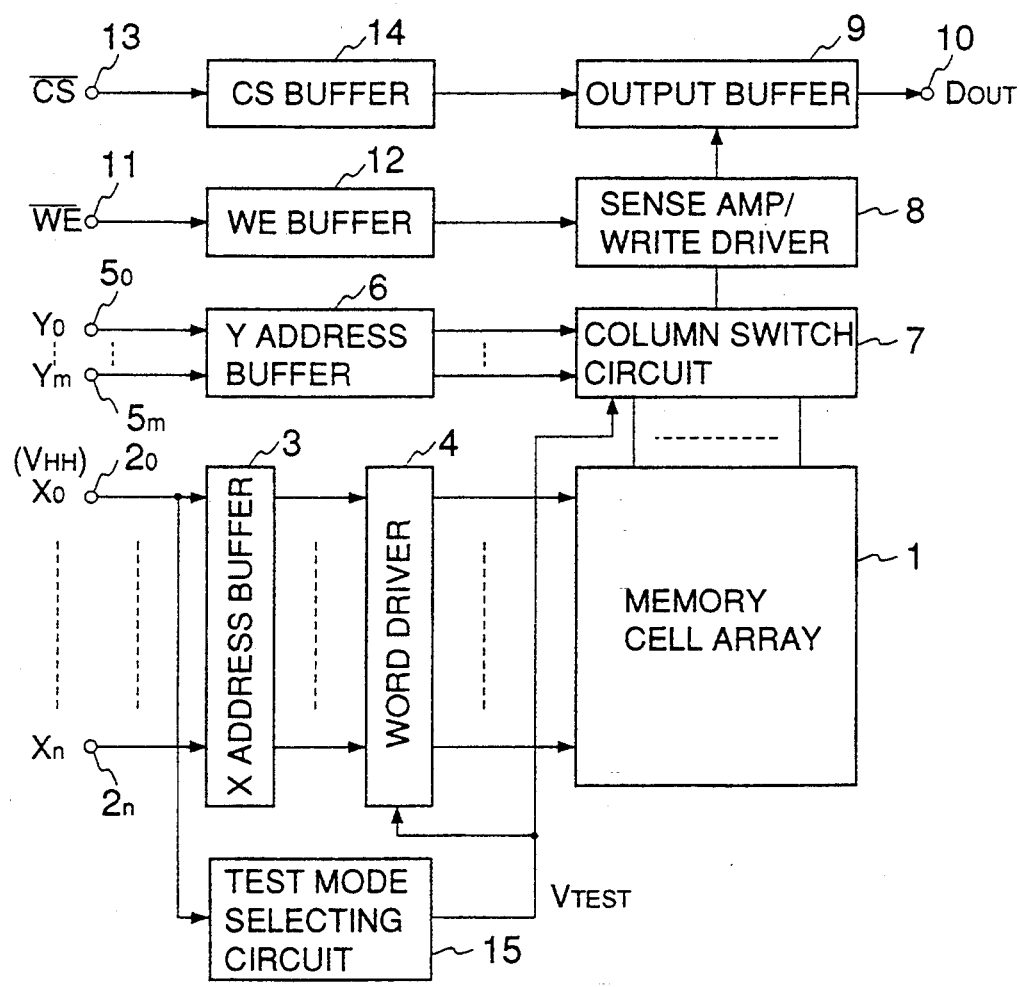
FIG. 1 is a block diagram of a SRAM device related to the present invention.

FIG. 1 shows an SRAM device having a built-in test mode selecting circuit. The SRAM device shown in FIG. 1 includes a memory cell array 1 having memory cells arranged in rows and columns, and X address signal input terminals $2_0$ through $2_n$ (n is an integer). to which X address signals (row address signals) $X_0$ through $X_n$ are applied. In the normal operation, each of the X address signals $X_0$ through $X_n$ has either a low (L) level, between 0 and 0.8 [V], or a high (H) level between 2.0 and 5.5 [V]. When a test mode is selected, a high level voltage $V_{HH}$, higher than the level of the X address signal $X_0$ and equal to, for example, 7 [V], is applied to the X address signal input terminal $2_0$.

The SRAM device includes an X address buffer 3, temporarily storing the X address signals $X_0$–$X_n$, and a word driver 4, decoding the X address signals $X_0$–$X_n$ stored in the X address buffer 3 and performing word line driving on the basis of the decoded address signals. The SRAM device includes column address signal input terminals $5_0$–$5_m$ (m is an integer), a Y address buffer 6, a column switch circuit 7. Y address signals (column address signals) $Y_0$–$Y_m$ are respectively applied to the column address signal input terminals $5_0$–$5_m$. The Y address buffer 6 temporarily stores the Y address signals $Y_0$–$Y_m$. The column switch circuit 7 decodes the Y address signals $Y_0$–$Y_m$ stored in the Y address buffer 6 and performs column selection on the basis of the decoded address signals.

The SRAM device includes a sense amplifier/write driver 8, an output buffer 9 and a data output terminal 10. The sense amplifier/write driver 8 includes a sense amplifier part which amplifies data read from the memory cell array 1 and a write driver part used when data is written into the memory cell array 1. The output buffer 9 latches output data $D_{out}$ and outputs it to the outside (i.e., extremely) of the SRAM device via the data output terminal 10.

The SRAM device includes a write enable signal terminal 11, a write enable (WE) buffer 12, a chip select signal input terminal 13, and a chip select (CS) buffer 14. A write enable signal /WE (symbol '/' denotes an active-low signal and corresponds to the "bar" positioned above the letters "WE" as shown in FIG. 1) is applied to the write enable signal input terminal 11. The WE buffer 12 temporarily stores the write enable signal /WE. A chip select signal /CS is applied to the chip select signal input terminal 13. The CS buffer 14 temporarily stores the chip select signal /CS.

A test mode selecting circuit 15 is provided as shown in FIG. 1. When the test mode is selected, the test mode selecting circuit 15 detects the high voltage $V_{HH}$ applied to the X address signal input terminal $2_0$ which is and equal to, for example, 7 [V], and sets the word driver 4 and the column switch circuit 7 to a test mode. $V_{TEST}$ denotes the output signal of the test mode selecting circuit 15. When the output signal $V_{TEST}$ is switched to the low (L) level, the word driver 4 drives all word lines, and the column switch circuit 7 selects all columns. In this state, the test is performed.

Figure 2:
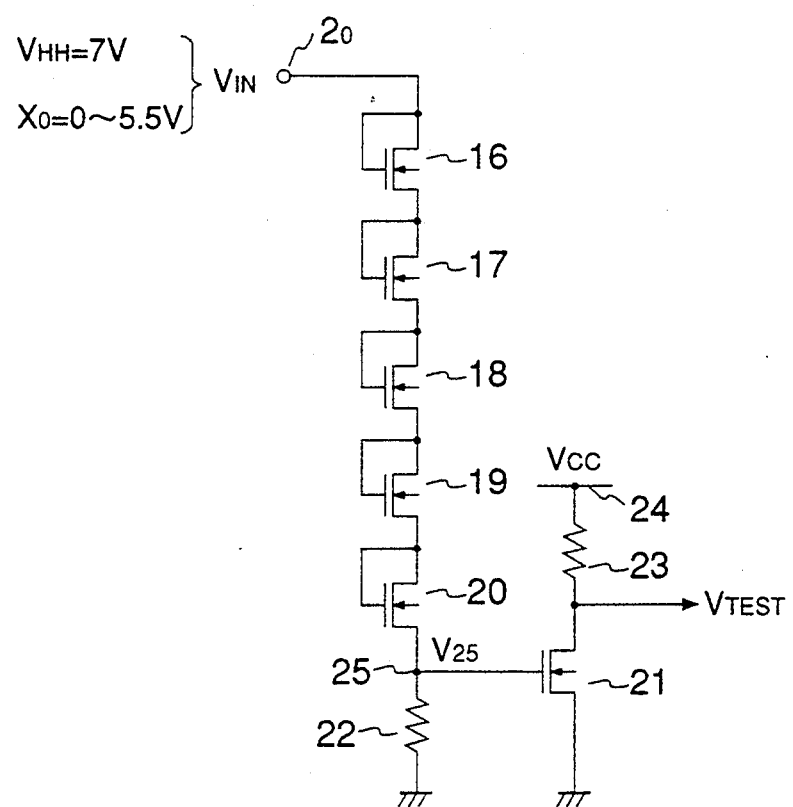
FIG. 2 is a circuit diagram of a test mode selecting circuit shown in FIG. 1.

FIG. 2 is a circuit diagram of the test mode selecting circuit 15, which is made up of n-channel field effect transistors such as MOS (Metal Oxide Semiconductor) transistors (hereinafter simply referred to as nMOS transistors) 16–21, resistors 22 and 23, and a power supply line $V_{CC}$ via which a power supply voltage Vcc of, for example, 5 [V] is applied. Each of the nMOS transistors 16–21 has a threshold voltage $V_{TH-N}$ of 1.0 [V].

Figure 3:
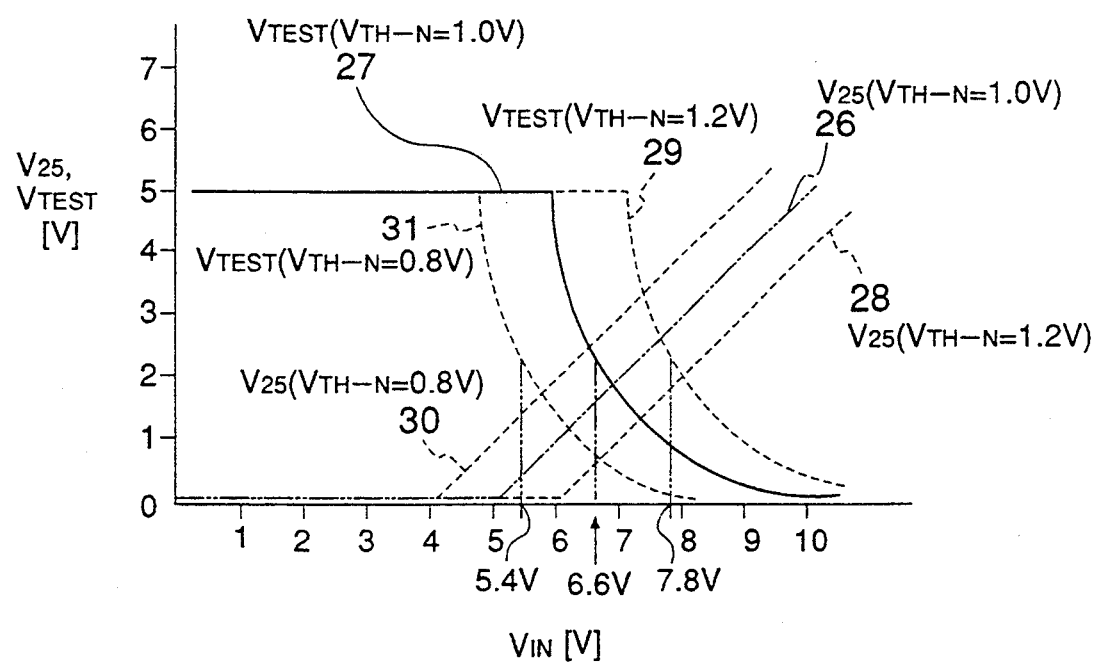
FIG. 3 is a graph of the input/output characteristic of the test mode selecting circuit shown in FIG. 2.

FIG. 3 is a graph of the input/output characteristic of the test mode selecting circuit 15. In FIG. 3, $V_{IN}$ denotes the voltage applied to the X address signal input terminal $2_0$, and $V_{25}$ denotes the voltage of a node 25 shown in FIG. 2. A two-dot chained line 26 indicates a variation in the voltage $V_{25}$ of the node 25 with respect to a change of the voltage $V_{IN}$ under the condition in which there is no deviation in the threshold voltages $V_{TH-N}$ of the nMOS transistors 16–21 and the threshold voltages $V_{TH-N}$ are equal to 1.0 [V]. A solid line 27 indicates a variation in the output voltage $V_{TEST}$ of the selecting circuit 15 with respect to a change of the voltage $V_{IN}$ under the condition in which there is no deviation in the threshold voltages $V_{TH-N}$ of the nMOS transistors 16–21 and the threshold voltages $V_{TH-N}$ are equal to 1.0 [V].

A broken line 28 indicates a variation in the voltage $V_{IN}$ under the condition in which the threshold voltages $V_{TH-N}$ of the nMOS transistors 16–21 deviate by +0.2 [V] and are equal to 1.2 [V]. A broken line 29 indicates a variation in the output voltage $V_{TEST}$ of the selecting circuit 15 with respect to a change of the voltage $V_{IN}$ under the condition in which the threshold voltages $V_{TH-N}$ of the nMOS transistors 16–21 deviate by +0.2 [V] and are equal to 1.2 [V].

A broken line 30 indicates a variation in the voltage $V_{IN}$ under the condition in which the threshold voltages $V_{TH-N}$ of the nMOS transistors 16–21 deviate by −0.2 [V] and are equal to 0.8 [V]. A broken line 31 indicates a variation in the output voltage $V_{TEST}$ of the selecting circuit 15 with respect to a change of the voltage $V_{IN}$ under the condition in which the threshold voltages $V_{TH-N}$ of the nMOS transistors 16–21 deviate by −0.2 [V] and are equal to 0.8 [V].

In the test mode selecting circuit 15, when there is no deviation in the threshold voltages $V_{TH-N}$ and $V_{TH-N}=1.0$ [v] and $V_{IN}<6 \times V_{TH-N}=6 \times 1.0=6.0$ [V], the nMOS transistors 16–21 are OFF, so that $V_{25}=0$ [V] and $V_{TEST}=5$ [V]. When $V_{IN} \geq 6 \times V_{TH-N}=6 \times 1.0=6.0$ [V], the nMOS transistors 16–21 are ON, so that the voltage $V_{25}$ rises as the voltage $V_{IN}$ rises, and the output voltage $V_{TEST}$ becomes lower as the voltage $V_{IN}$ becomes higher, due to the characteristic of an inverter made up of the nMOS transistor 21 and the resistor 23.

When the threshold voltage of the test mode selecting circuit 15 is denoted as $V_{TH-TEST}$, this threshold voltage $V_{TH-TEST}$ is approximately equal to 6.6 [V] when $V_{TH-N}$ is equal to 1.0 [V]. When $V_{IN}$ is between 0 and 5.5 [V], that is, when the X address signal $X_0$ is applied to the X address signal input terminal $2_0$, the output voltage $V_{TEST}$ is switched to the high (H) level and the normal operation mode is hence selected.

When the voltage $V_{IN}$ is equal to 7.0 [V], that is, when the high voltage $V_{HH}$ for mode selection is applied to the X address signal input terminal $2_0$, the output voltage $V_{TEST}$ is switched to the low (L) level and hence the test mode is selected.

However, there is a possibility that the threshold voltages of the nMOS transistors 16–21 may deviate from the designed threshold voltages due to a cause introduced in the production process. In this case, the value of the voltage $V_{IN}$ at which the logic level of the output voltage $V_{TEST}$ switches, that is, the threshold voltage $V_{TH-TEST}$ of the test mode selecting circuit 15, will be greatly varied due to the deviations of the threshold voltages of the nMOS transistors 16–21. This leads to a malfunction of the test mode selecting circuit 15.

If there is a deviation of +0.2 [V] in the threshold voltages $V_{TH-N}$, the resultant deviation of the threshold voltage $V_{TH-TEST}$ is +1.2 [V] ($=+0.2 \times 6$), and hence the threshold voltage $V_{TH-TEST}$ becomes equal to 7.8 [V] ($=6.6+1.2$). As a result, in this case, even if the voltage $V_{IN}$ is set to 7 [V] in order to switch to the test mode, the output voltage $V_{TEST}$ is not switched to the low (L) level, and hence the test mode cannot be selected. In this case, if the high voltage $V_{HH}$ is set equal to 8.0 [V], the output voltage $V_{TEST}$ can be switched to the low level. However, the transistors forming the row address buffer 3 shown in FIG. 1 may be damaged.

If there is a deviation of −0.2 [V] in the threshold voltages $V_{TH-N}$, the resultant deviation of the threshold voltage $V_{TH-TEST}$ is −1.2 [V] ($=-0.2 \times 6$), and hence the threshold voltage $V_{TH-TEST}$ becomes equal to 5.4 [V] ($=6.6-1.2$). As a result, in this case, when the X address signal $X_0$ is switched to the high (H) level and becomes equal to 5.5 [V] in the normal operation mode, the nMOS transistors 16–21 are switched to ON and the output signal $V_{TEST}$ is switched to the low level. Hence, the test mode is mistakenly set.

Since the high level of the address signals is required to fall in the range 2.0–5.5 [V] to satisfy the standard, it is necessary to design the circuit so that the X address signal $X_0$ having the high level between 2.0–5.5 [V] is input.

As described above, in the structure shown in FIGS. 1 and 2, the threshold voltage $V_{TH\text{-}TEST}$ of the test mode selecting circuit 15 greatly depends on the threshold voltages $V_{TH\text{-}N}$ of the nMOS transistors 16–21 thereof, and the test mode cannot be selected with high reliability if the threshold voltages $V_{TH\text{-}N}$ deviate from the designed threshold voltage.

Figure 4:
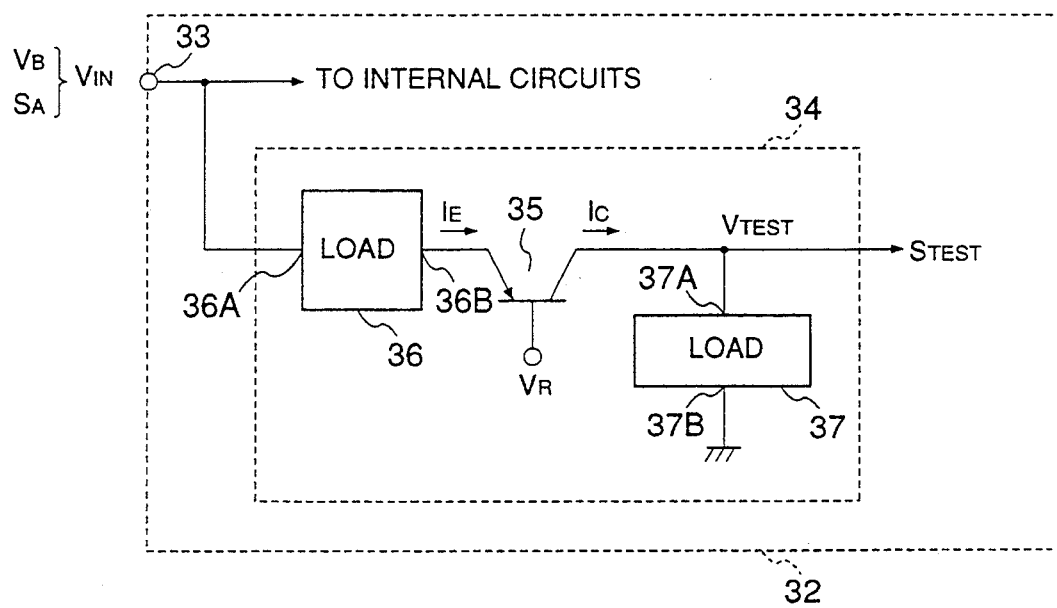
FIG. 4 is a block diagram of the principle of the present invention.

FIG. 4 shows the principle of the present invention. A semiconductor integrated circuit device 32 includes a test mode selecting circuit 34 and an external-connection terminal 33. A binary signal $S_A$ is applied to an external-connection terminal 33 in the normal operation mode of the device 32 and a predetermined high voltage $V_B$, higher than the level of the binary signal $S_A$, is applied thereto in the test mode. The binary signal $S_A$ is an address signal when the device 32 is a semiconductor memory device.

The test mode selecting circuit 34 includes a PNP transistor 35 and load devices 36 and 37. A voltage $V_R$, necessary to operate the PNP transistor 35, is applied to the base of the PNP transistor 35. The test mode selecting circuit 34 outputs a test mode selecting signal $S_{TEST}$ via the collector of the PNP transistor 35 when the predetermined high voltage $V_b$, higher than the binary signal $S_A$, is applied to the external-connection terminal 33.

Figure 5:
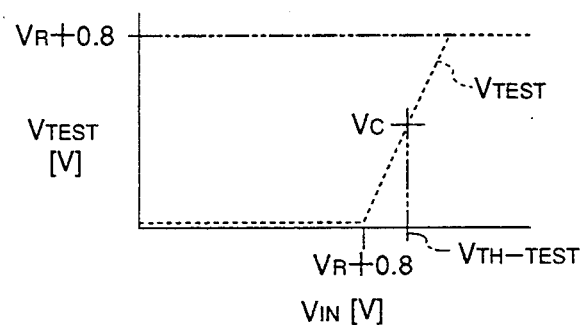
FIG. 5 is a graph of the input/output circuit of a test mode selecting circuit shown in FIG. 4.

FIG. 5 is a graph of the input/output characteristic of the test mode selecting circuit 34. In other words, FIG. 5 shows a variation in the output signal $S_{TEST}$ (the collector voltage of the PNP transistor 35) of the test mode selecting circuit 34 with respect to a change of the voltage $V_{IN}$ applied to the external-connection terminal 33. In the test mode selecting circuit 34, when the voltage $V_{IN}$ applied to the terminal 33 is lower than $V_R + 0.8$ [V] (the value 0.8 [V] is the base-emitter voltage of the PNP transistor 35), the PNP transistor 35 is OFF and then $V_{TEST} = 0$ [V].

When the voltage $V_{IN}$ is equal to or higher than $V_R + 0.8$ [V], the PNP transistor 35 is ON and the output voltage $V_{TEST}$ rises as $V_{IN}$ rises. When the output voltage $V_{TEST}$ becomes equal to $V_R + 0.8$ [V], the PNP transistor 35 is saturated and the output voltage $V_{TEST}$ becomes constant and independent of the rise of the voltage $V_{IN}$. Hence, in the case where the output voltage $V_{TEST}$ is between 0 [V] and $V_R + 0.8$ [V], and is equal to a predetermined voltage $V_C$, higher than the value of the voltage $V_{TEST}$ obtained when the binary signal $S_A$ is at the high level, and when the voltage $V_{TEST}$ is used as the test mode selecting signal $S_{TEST}$, the value of the voltage $V_{IN}$ obtained when $V_{TEST} = V_C$ can be the threshold voltage $V_{TH\text{-}TEST}$ of the test mode selecting circuit 34.

In the above manner, the threshold voltage $V_{TH\text{-}TEST}$ of the test mode selecting circuit 34 is determined so that the normal operation mode is selected when $V_{IN} < V_{TH\text{-}TEST}$ and the test mode is selected when $V_{IN} > V_{TH\text{-}TEST}$.

In the case where $V_{IN} \geq V_R + 0.8$ [V] and $V_{TEST} \leq V_R + 0.8$ [V], and when the resistance values of the load devices 36 and 37 are respectively denoted by $R_{36}$ and $R_{37}$ and $I_E$ (the emitter current of the PNP transistor 35) is nearly equal to $I_C$ (the collector current of the PNP transistor 35), the following equations are obtained:

$$(V_{IN} - V_R - 0.8)/R_{36} = V_{TEST}/R_{37}$$

$$V_{TEST} = (V_{IN} - V_R - 0.8) \times R_{37}/R_{36}$$

Hence, $V_{TH\text{-}TEST} = R_{36}/R_{37} \cdot V_C + V_R + 0.8$, and the threshold voltage $V_{TH\text{-}TEST}$ is determined by the ratio $R_{36}/R_{37}$, the predetermined voltage $V_R$ and the base-emitter voltage $V_{BE}$ of the PNP transistor 35. It is possible to obtain a constant value of the ratio $R_{36}/R_{37}$ by forming the load devices 36 and 37 of an identical material. In the test mode, the constant value of the predetermined voltage $V_R$ can be supplied by an LSI tester. The base-emitter voltage of the PNP transistor 35 does not have (i.e. undergo) any deviation because it is determined by the p-n junction.

Hence, according to the present invention, the threshold voltages $V_{TH\text{-}TEST}$ of the test mode selecting circuits 34 of the different devices do not have (i.e. undergo) any deviation even if the nMOS transistors of the devices have different threshold voltages.

Figure 6:
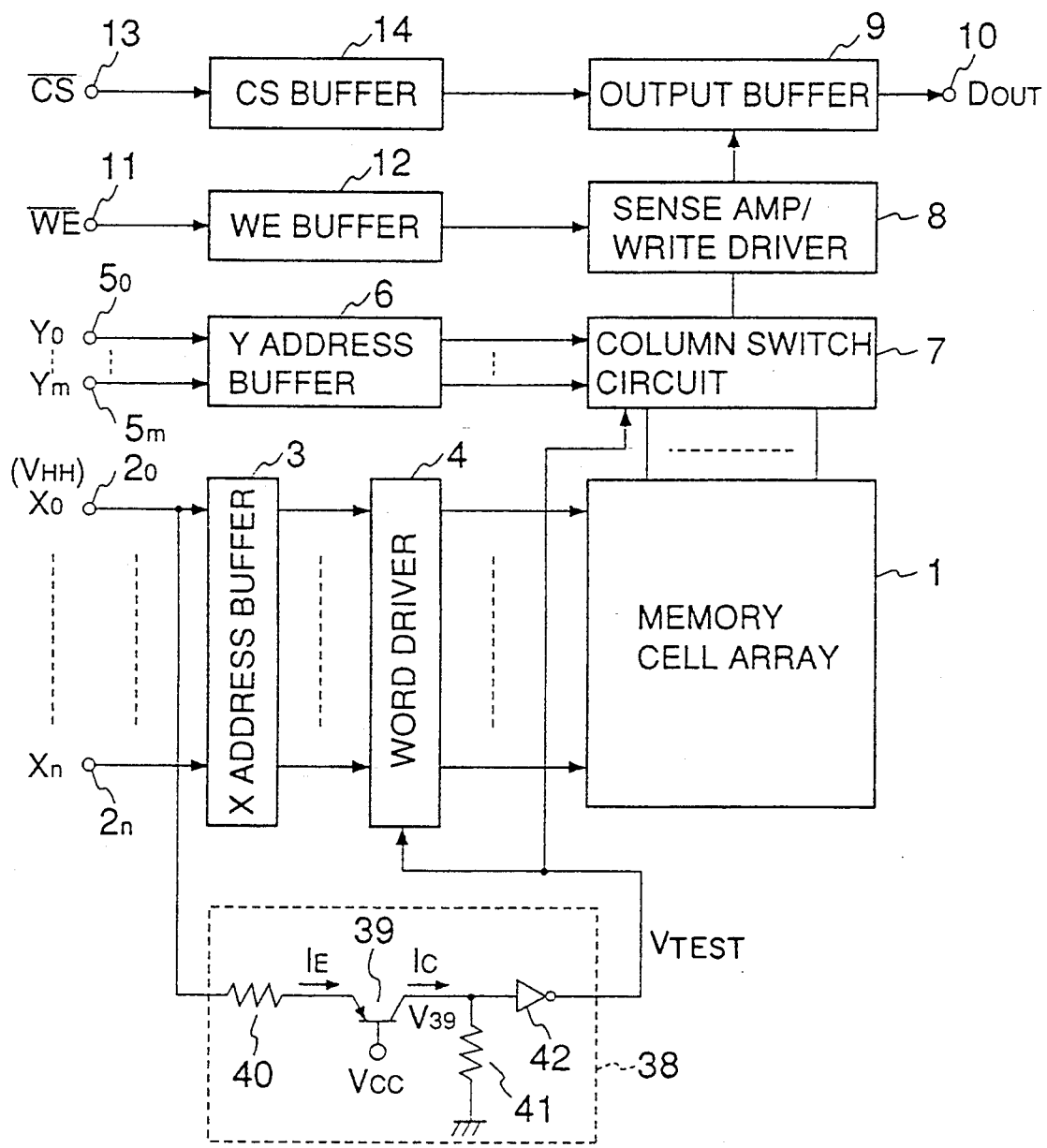
FIG. 6 is a block diagram of an SRAM device according to an embodiment of the present invention.

FIG. 6 shows the structure of an SRAM device having a test mode selecting circuit 38 according to an embodiment of the present invention. The SRAM device shown in FIG. 6 differs from that shown in FIG. 1 in that a test mode selecting circuit 38 is substituted for the test mode selecting circuit 15 shown in FIG. 1, the circuit 38 having a circuit configuration different from that of the circuit 15. The other parts of the SRAM device shown in FIG. 6 are the same as those of the SRAM device shown in FIG. 1.

The test mode selecting circuit 38 includes a PNP transistor 39, resistors 40 and 41 made of polysilicon, and an inverter 42 formed by, for example, a CMOS inverter. A power supply voltage Vcc of, for example, 5 [V], is applied to the base of the PNP transistor 39. The circuit is configured so that $I_E$ is nearly equal to $I_C$ when the common-emitter static forward current transfer ratio $h_{FE}$ of the PNP transistor 39 is equal to 10. The resistance $R_{40}$ of the resistor 40 is equal to 1 KΩ and the resistance $R_{41}$ of the resistor 41 is equal to 5 KΩ.

The PNP transistor 39 is formed by, for example, a lateral-type PNP transistor utilizing pMOS transistors.

Figure 7:
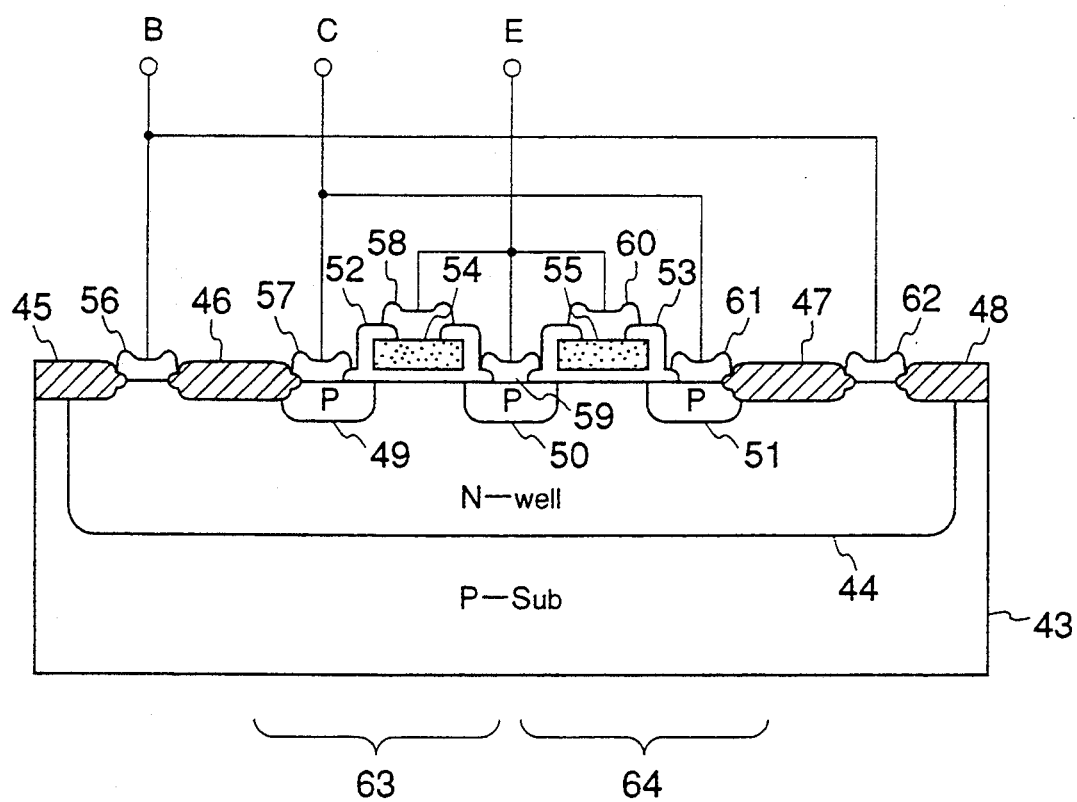
FIG. 7 is a cross-sectional view of a structure of transistors forming a test mode selecting circuit shown in FIG. 6.

FIG. 7 is a cross-sectional view of such a lateral-type PNP transistor. As shown in FIG. 7, the PNP transistor includes a P-type silicon substrate, an N-type well 44, field oxide films 45–48, P-type diffusion layers 49–51, insulating layers 52 and 53, polysilicon layers 54 and 55, and aluminum layers 56–62. A P-type MOS transistor (hereinafter referred to as a pMOS transistor) 63 is formed by the P-type diffusion layers 49 and 50 and the polysilicon layer 54. The diffusion layers 49 and 50 are respectively the drain and source regions of the pMOS transistor 63, and the polysilicon layer 54 is the gate thereof. A pMOS transistor 64 is formed by the P-type diffusion layers 50 and 51 and the polysilicon layer 55. The diffusion layers 50 and 51 are respectively the source and drain regions of the pMOS transistor 64, and the polysilicon layer 54 is the gate thereof.

The PNP transistor 39 has a base region formed by the N-type well 44, an emitter region formed by the P-type diffusion layer 50 serving as the source regions of the pMOS transistors 63 and 64, and a collector region formed by the P-type diffusion layers 49 and 51. Further, the P-type diffusion layer 50 is electrically connected to the polysilicon layers 54 and 55 serving as the gates of the pMOS transistors 63 and 64.

Figure 8:
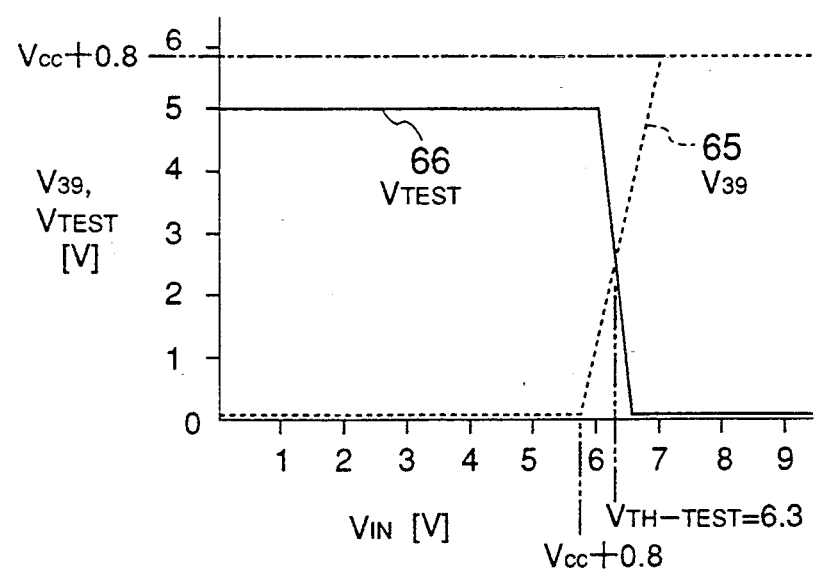
FIG. 8 is a graph of the input/output characteristic of the test mode selecting circuit shown in FIG. 6.

FIG. 8 is a graph of the input/output characteristic of the test mode selecting circuit 38. In FIG. 8, a broken line 65 indicates the collector voltage $V_{39}$ of the PNP transistor 39, and a solid line 66 indicates the output voltage $V_{TEST}$ of the test mode selecting circuit 38 in FIG. 6. When the voltage $V_{IN}$ applied to the X address signal input terminal $2_0$ is lower than $Vcc+0.8$ [V] (0.8 [V] is the base-emitter voltage of the PNP transistor 39), the PNP transistor 39 is OFF and $I_E=I_C=0$. Hence, the output voltage $V_{TEST}$ becomes 0 [V].

When the voltage $V_{IN}$ becomes equal to or higher than $Vcc+0.8$ [V], the PNP transistor 39 is turned ON. Then, the emitter current $I_E$ flows. Since the emitter current $I_E$ is nearly equal to the collector current $I_C$, the following equations can be obtained:

$$(V_{IN}-Vcc-0.8)/R_{40}=V_{39}/RV_{41}$$

$$V_{39}=(V_{IN}-Vcc-0.8)\times R_{41}/R_{40}.$$

However, when $V_{39}=Vcc+0.8$, the PNP transistor 39 is saturated. Hence, the voltage $V_{39}$ is clamped at $Vcc+0.8$ [V] independently of an increase in the voltage $V_{IN}$.

If the threshold voltage of the inverter 42 is equal to $Vcc/2$, the threshold voltage $V_{TH-TEST}$ of the test mode selecting circuit 38 is written as follows:

$$\begin{aligned} V_{IN} &= R_{40}/R_{41} \cdot V_{39} + Vcc + 0.8 \\ V_{TH-TEST} &= R_{40}/R_{41} \cdot Vcc/2 + Vcc + 0.8 \\ &= 1/5 \cdot 1/2 \cdot 5 + 5 + 0.8 \\ &= 6.3 [V] \end{aligned}$$

As described above, according to the present embodiment, the threshold voltage $V_{TH-TEST}$ of the test mode selecting circuit 38 is determined by the ratio $R_{40}/R_{41}$, the power supply voltage Vcc and the base-emitter voltage $V_{BE}$ of the PNP transistor 39. Since the resistors 40 and 41 are formed of polysilicon, the ratio $R_{40}/R_{41}$ does not contain (i.e., is not subject to) any deviation. In the test mode, the power supply voltage Vcc is supplied by an LSI tester, and has little deviation. The base-emitter voltage $V_{BE}$ of the PNP transistor 39 does not have any deviation because it is determined by the p-n junction.

Hence, according to the present invention, the threshold voltages $V_{TH-TEST}$ ($=6.3$ [V] in the above-mentioned example) of the test mode selecting circuits 38 of the different devices do not have any deviation even if the nMOS transistors of the devices have different threshold voltages. When the voltages $V_{IN}$ and $V_{HH}$ are selected in the test mode so that $V_{IN}=V_{HH}=7$ [V], the output signal $V_{TEST}$ can be switched to the low level and hence the test mode can be selected.

Even in the case where the X address signal $X_0$ is at the high level 5.5 [V], the voltage $V_{TEST}$ is not switched to the low level but is maintained at the high level. Hence, the test mode is not selected in this case.

Even in the case where there are deviations in the characteristics of the circuit elements arising from a cause introduced in the production process, there is no possibility that the threshold voltage $V_{TH-TEST}$ of the test mode selecting circuit 38 is varied. Hence, the test mode can be selected with high reliability.

Further, according to the present embodiment, since the PNP transistor 39 is formed of the lateral-type PNP transistor comprising the pMOS transistors 63 and 64, an additional production step is not needed when fabricating CMOS SRAM devices including the test mode selecting circuits 38.

Figure 9:
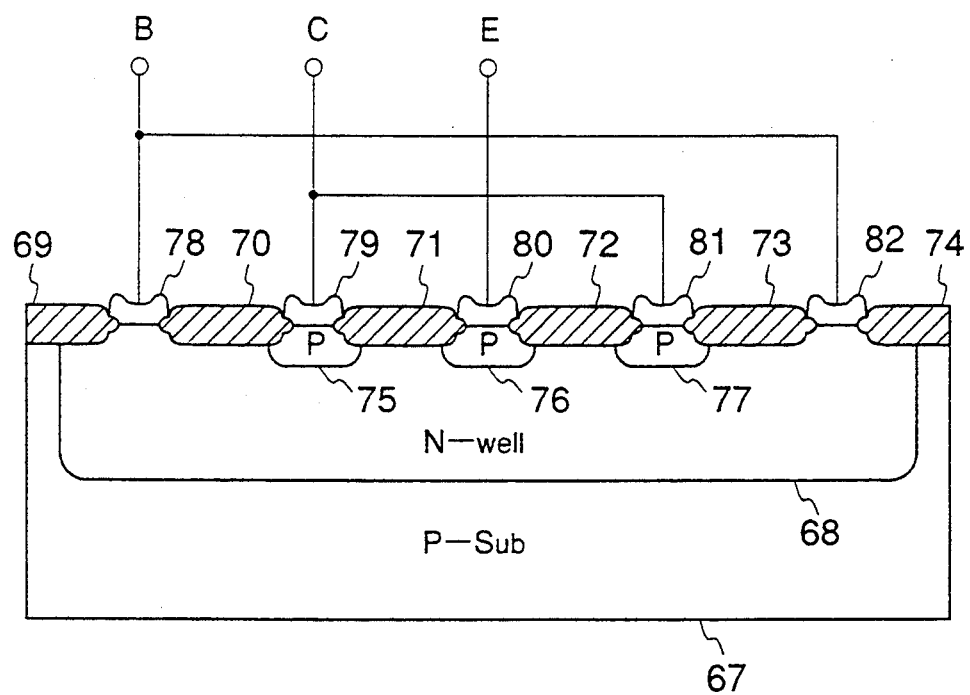
FIG. 9 is a cross-sectional view of another structure of transistors forming the test mode selecting circuit shown in FIG. 6.

FIG. 9 shows another possible cross-sectional structure of the PNP transistor 39. The PNP transistor 39 shown in FIG. 9 includes a P-type silicon substrate, an N-type well 68, field oxide films 69–74, P-type diffusion layers 75–77, and aluminum layers 78–82. In the structure shown in FIG. 9, the N-type well 68 serves as the base region of the PNP transistor 39, the P-type diffusion layer 76 serves as the emitter region thereof, and the P-type diffusion layers 75 and 77 serve as the collector region thereof.

According to the present invention, the output voltage of the test mode selecting circuit is determined by the ratio of the resistance of the load device (36) to that of the load device (37), the predetermined voltage ($V_R$) applied to the base of the PNP transistor (35), and the base-emitter voltage of the PNP transistor (35). Hence, the threshold voltage ($V_{TH-TEST}$) of the test mode selecting circuit is made constant even if there are deviations of the circuit parameters. Hence, switching between the normal operation mode and the test mode can be realized with high reliability.

The present invention is not limited to SRAM devices but is applicable to other semiconductor integrated circuit devices such as DRAMs.

The present invention is not limited to the specifically disclosed embodiments, and variations and modifications may be made without departing from the scope of the present invention.

What is claimed is:

1. A semiconductor integrated circuit device having: internal circuits;
   a test mode selecting circuit connected to the internal circuits for setting the internal circuits to a test mode, said test mode selecting circuit comprising:
   a first load device,
   a lateral-type PNP transistor having a first terminal for receiving a signal via the first load device, a control terminal for receiving a first voltage and a second terminal, the first and second terminals of the lateral-type PNP transistor respectively comprising an emitter and a collector of the lateral-type PNP transistor and the control terminal of the lateral-type PNP transistor comprising a base thereof,
   a second load device connected between the second terminal of the lateral-type PNP transistor and a reference voltage node, and
   a test mode selecting signal being output via the second terminal of the lateral-type PNP transistor when a second voltage, higher than the voltage of the signal applied to the first load device in a normal operation mode, is applied thereto, the test mode selecting signal being applied to predetermined internal circuits among said internal circuits so that the predetermined internal circuits are switched to states of a test mode from the normal operation mode.

2. A semiconductor integrated circuit device as claimed in claim 1, wherein said first voltage is a power supply voltage.

3. The semiconductor integrated circuit device as claimed in claim 1, wherein the first and second load devices comprise elements functioning as resistors.

4. A semiconductor integrated circuit device comprising:
   internal circuits;
   a test mode selecting circuit connected to the internal circuits for setting the internal circuits to a test mode, the test mode selecting circuit comprising:
      a first load device,
      a PNP transistor having a first terminal for receiving a signal via the first load device, a control terminal for receiving a first voltage and a second terminal, the first and second terminals of the PNP transistor respectively comprising an emitter and a collector of the PNP transistor and the control terminal of the PNP transistor comprising a base thereof, the PNP transistor comprising a plurality of P-channel field effect transistors;
      a second load device connected between the second terminal of the PNP transistor and a reference voltage node; and
      a test mode selecting signal being output via the second terminal of the PNP transistor when a second voltage higher than the voltage of the signal applied to the first load device in a normal operation mode is applied thereto, the test mode selecting signal being applied to predetermined internal circuits among said internal circuits, so that the predetermined internal circuits are switched to states of a test mode from the normal operation mode.

5. The semiconductor integrated circuit device as claimed in claim 4, wherein said first voltage is a power supply voltage.

6. The semiconductor integrated circuit device as claimed in claim 4, wherein the first and second load devices comprise respective elements functioning as resistors.

7. A semiconductor integrated circuit device having:
   internal circuits;
   a test mode selecting circuit connected to the internal circuits, the test mode selecting circuit comprising:
      a first load device;
      a PNP transistor having a first terminal for receiving a signal via the first load device, a control terminal for receiving a first voltage and a second terminal, the first and second terminals of the PNP transistor respectively comprising an emitter and a collector of the PNP transistor, and the control terminal of the PNP transistor comprising a base thereof, the PNP transistor further comprising an N-type layer serving as the base of said PNP transistor and two P-channel field effect transistors formed in the N-type layer and comprising a plurality of P-type diffusion layers formed in the N-type layer, one of the P-type diffusion layers comprising a common source of the two P-channel field effect transistors and serving as the emitter of the PNP transistor and two others of the P-type diffusion layers respectively comprising the drains of the two P-channel field effect transistors and serving in common as the collector of the PNP transistor, and gate electrodes, the gate electrodes of the two P-channel field effect transistors being formed on an insulating layer in turn formed on the N-type layer and electrically connected to the P-type diffusion layer serving as the common source, and
      a second load device provided between the second terminal of the PNP transistor and a reference voltage node; and
      a test mode selecting signal being output via the second terminal of the PNP transistor when a second voltage, higher than the voltage of the signal applied to the first load device in a normal operation mode, is applied thereto, the test mode selecting signal being applied to predetermined internal circuits among said internal circuits so that the predetermined internal circuits are switched to states of a test mode from the normal operation mode.

8. The semiconductor integrated circuit device as claimed in claim 7, wherein said first voltage is a power supply voltage.

9. The semiconductor integrated circuit device as claimed in claim 7, wherein the first and second load devices comprise respective elements functioning as resistors.

10. A semiconductor integrated circuit device having:
    internal circuits;
    a test mode selecting circuit connected to the internal circuits, the test mode selecting circuit comprising:
       a first load device;
       a PNP transistor having a first terminal for receiving a signal via the first load device, a control terminal for receiving a first voltage and a second terminal, the first and second terminals of the PNP transistor respectively comprising an emitter and a collector of the PNP transistor and the control terminal of the PNP transistor comprising a base thereof, the PNP transistor further comprising an N-type layer serving as the base thereof and a plurality of P-type diffusion layers formed in the N-type layer, one of the P-type diffusion layers serving as the collector and two others of the plurality of P-type diffusion layers serving, in common, as the emitter of the PNP transistor, and
       a second load device connected between the second terminal of the PNP transistor and a reference voltage node; and
       a test mode selecting signal being output via the second terminal of the PNP transistor when a second voltage higher than the voltage of the signal applied to the first load device in a normal operation mode is applied thereto, the test mode selecting signal being applied to predetermined internal circuits among said internal circuits, so that the predetermined internal circuits are switched to states of a test mode from the normal operation mode.

11. The semiconductor integrated circuit device as claimed in claim 10, wherein said first voltage is a power supply voltage.

12. The semiconductor integrated circuit device as claimed in claim 10, wherein the first and second load devices comprise elements functioning as resistors.

* * * * *

UNITED STATES PATENT AND TRADEMARK OFFICE
CERTIFICATE OF CORRECTION

PATENT NO. : 5,450,362
DATED : Sep. 12, 1995
INVENTOR(S) : MATSUZAKI

It is certified that error appears in the above-indentified patent and that said Letters Patent is hereby corrected as shown below:

Col. 1, line 10, delete the paragraph indention;
line 68, change "lines." to --lines --.

Col. 2, line 53, after "level" (second occurrence) insert --,--.

Col. 3, line 17, change "'/'" to --"/"--;
line 19, change ""WE"" to --"WE",--;
line 28, before "which is" insert --and--;
line 29, delete "and" (first occurrence).

Col. 5, line 29, change "$V_b$," to --$V_B$ ,--.

Signed and Sealed this

Tenth Day of June, 1997

Attest:

BRUCE LEHMAN

*Attesting Officer*  *Commissioner of Patents and Trademarks*